(12) United States Patent
Jin

(10) Patent No.: US 8,907,413 B1
(45) Date of Patent: Dec. 9, 2014

(54) DUAL TRENCH MOS TRANSISTOR AND METHOD FOR FORMING THE SAME

(71) Applicant: Chip Integration Tech. Co., Ltd., Zhubei, Hsinchu County (TW)

(72) Inventor: Qinhai Jin, Zhubei (TW)

(73) Assignee: Chip Integration Tech. Co., Ltd., Zhubei, Hsinchu County (TW)

( * ) Notice: Subject to any disclaimer, the term of this patent is extended or adjusted under 35 U.S.C. 154(b) by 0 days.

(21) Appl. No.: 14/093,596

(22) Filed: Dec. 2, 2013

(30) Foreign Application Priority Data

Jun. 24, 2013 (TW) .............................. 102122482 A

(51) Int. Cl.
*H01L 29/66* (2006.01)
*H01L 29/78* (2006.01)

(52) U.S. Cl.
CPC .................................. *H01L 29/7827* (2013.01)
USPC ........... 257/330; 257/331; 257/332; 257/333; 257/334

(58) Field of Classification Search
USPC .......................... 257/330, 331, 332, 333, 334
See application file for complete search history.

(56) References Cited

U.S. PATENT DOCUMENTS

| | | | | |
|---|---|---|---|---|
| 6,903,421 | B1* | 6/2005 | Huang et al. | 257/356 |
| 6,974,750 | B2* | 12/2005 | Haase | 438/270 |
| 8,703,606 | B2* | 4/2014 | Kirimura | 438/640 |
| 8,710,584 | B2* | 4/2014 | Bencuya et al. | 257/330 |
| 2004/0191994 | A1* | 9/2004 | Williams et al. | 438/270 |
| 2004/0259318 | A1* | 12/2004 | Williams et al. | 438/400 |
| 2006/0157818 | A1* | 7/2006 | Williams et al. | 257/511 |
| 2011/0127602 | A1* | 6/2011 | Mallikarjunaswamy | 257/331 |
| 2012/0129338 | A1* | 5/2012 | Kirimura | 438/637 |

* cited by examiner

*Primary Examiner* — Bilkis Jahan
(74) *Attorney, Agent, or Firm* — McClure, Qualey & Rodack, LLP

(57) ABSTRACT

A dual trench MOS transistor comprises of the following elements. A plurality of trenches are formed in an n− epitaxial layer on a heavy doped n+ semiconductor substrate and spaced to each other by one mesa. Each the trench has a trench oxide layer formed on a bottom and sidewalls thereof. A first polysilicon layer is formed in the trenches. A plurality of recesses are formed in the mesas and spaced to each other with one sub-mesa. Each the recess has a recess oxide layer formed on a bottom and sidewalls thereof. A second polysilicon layer for serving as a gate is formed in the recesses. The mesas are implanted to have implanted areas at two side of the gate. The implanted areas and the first polysilicon layer are applied to serve as the source. The rear surface of the substrate is served as the drain.

8 Claims, 13 Drawing Sheets

DUAL TRENCH MOS TRANSISTOR AND METHOD FOR FORMING THE SAME

FIELD OF THE INVENTION

The present invention relates to a semiconductor device, and more particularly to a new structure of dual trench MOS transistor and the method for forming the same.

BACKGROUND OF THE INVENTION

The power IC is widely applied for power management and power control. By controlling the power switching device to switch on or off, the power IC can perform the function of power management and power control. The power MOS (metal/oxide/semiconductor) is the most popular and widely used power device currently.

The primary characteristics of the power switching devices include of low manufacturing cost, low resistance in conducting state and fast switching. The low resistance is benefit for very low voltage drop under high driving current. The trench power MOS transistor with above property can refer to the U.S. Pat. No. 6,974,750. As shown in FIG. 1, the plural trenches are formed in an n− epitaxial layer 5b on a heavy doped n+ semiconductor substrate 1. A trench oxide layer 8 is formed on all surfaces in the trenches 7 (the sidewalls, bottoms and mesas). Then, an n type doped polysilicon layer 9 is formed on the trench oxide layer 8 to serve as a gate. The p− body 4b and the n+ implanted areas 6 as a source are formed in the n− epitaxial layer 5b below the mesas between trenches. An oxide layer 10 is formed on the polysilicon layer 9. The oxide layer 10 is then etched by photolithography to form recess thereon. The etching is performed even through the n+ implanted area 6 until the p− body 4b to form a "V" shape source contact area. Under the source contact area is a p+ heavy doped area 12 formed by performing an ion implanting procedure. A metal layer 13 is formed to fill in the "V" shape source contact area. The drain metal layer 14 is formed on the rear surface of the heavy doped n+ semiconductor substrate 1.

SUMMARY OF THE INVENTION

The present invention provides a new structure of dual trench MOS transistor and the method for forming the same. The dual trench MOS transistor comprises of the following elements. A plurality of trenches are formed in an n− epitaxial layer on a heavy doped n+ semiconductor substrate and are spaced to each other by one of mesas, wherein each the trench has a trench oxide layer formed on a bottom and sidewalls thereof. A first polysilicon layer with a conductive impurity is formed in the trenches. A plurality of recesses are formed in the mesas and spaced to each other with one sub-mesa, and each the recess has a recess oxide layer formed on a bottom and sidewalls thereof. A second polysilicon layer with a conductive impurity for serving as a gate is formed in the recesses to form MOS structures. Each the MOS structure includes the second polysilicon layer, the recess oxide layer and the n− epitaxial layer. An ion implanted area is formed in the n− epitaxial layer below the sub-mesas at two sides of the MOS structures.

An interconnect dielectric layer is formed on the first polysilicon layer, the second polysilicon layer and the ion implanted area. A plurality of through holes are formed in the interconnect dielectric layer, wherein a first group of the through holes connect the first polysilicon layer in the trenches and the ion implanted area which are applied to serve as a source and a second group of the through holes connect the gate of the MOS structures. An interconnect metal layer is formed on the interconnect dielectric layer and in the plurality of the through holes and is patterned to connect the source and the gate separately via the through holes. Another metal layer is formed on a rear surface of the heavy doped n+ semiconductor substrate for serving as a drain.

In the second embodiment, a plurality of trenches are formed in an n− epitaxial layer on a heavy doped n+ semiconductor substrate and are spaced to each other by one of mesas. Each the trench has a trench oxide layer formed on a bottom and sidewalls thereof and formed on the mesas. A first polysilicon layer with a conductive impurity is formed in the plurality of trenches, and an oxide layer is formed on the first polysilicon layer in the trenches. A plurality of recesses are formed in the mesas and spaced to each other with a sub-mesa. Each the recess has a recess oxide layer formed on a bottom and sidewalls thereof. A second polysilicon layer with a conductive impurity for serving as a gate is formed in the plurality of recesses and on the oxide layer in the plurality of trenches, the second polysilicon layer is patterned to form a plurality of rows of MOS structures, wherein each the MOS structure includes the second polysilicon layer, the recess oxide layer and the n− epitaxial layer. Ion implanted areas are formed in the n− epitaxial layer below the mesas at two sides of the MOS structures by implanting conductive ions. An interconnect dielectric layer is formed on the first polysilicon layer, the second polysilicon layer and the recess oxide layer. A plurality of through holes are formed in the interconnect dielectric layer for connecting the ion implanted areas and through the oxide layer for connecting the first polysilicon layer in the plurality of trenches, wherein the ion implanted areas and the first polysilicon layer serve as a source. An interconnect metal layer is formed on the interconnect dielectric layer and in the plurality of the through holes for connecting the source. A bottom metal layer is formed on a rear surface of the heavy doped n+ semiconductor substrate for serving as a drain.

The present invention also provides the method for forming the dual trench MOS transistors as illustrated in above two embodiments.

DESCRIPTION OF THE PREFERRED EMBODIMENT

The present invention discloses a dual trench MOS transistor. The symbol "#" of FIG. #A, FIG. #B and FIG. #C means the number of figures, and the capital letters A, B and C after the symbol "#" correspond with the lines AA', BB' and CC' shown in top views of Figs. For best understanding of the detailed structures, the interconnect dielectric layer and the interconnect metal layer are not shown in the top views. The relations between the interconnect metal layer and the device structure can refer to the source contact pad SP and the gate contact pad GP. Besides, the detailed structures of the device are shown in the cross sectional views of FIG. 8A to FIG. 8C.

Figure 1:
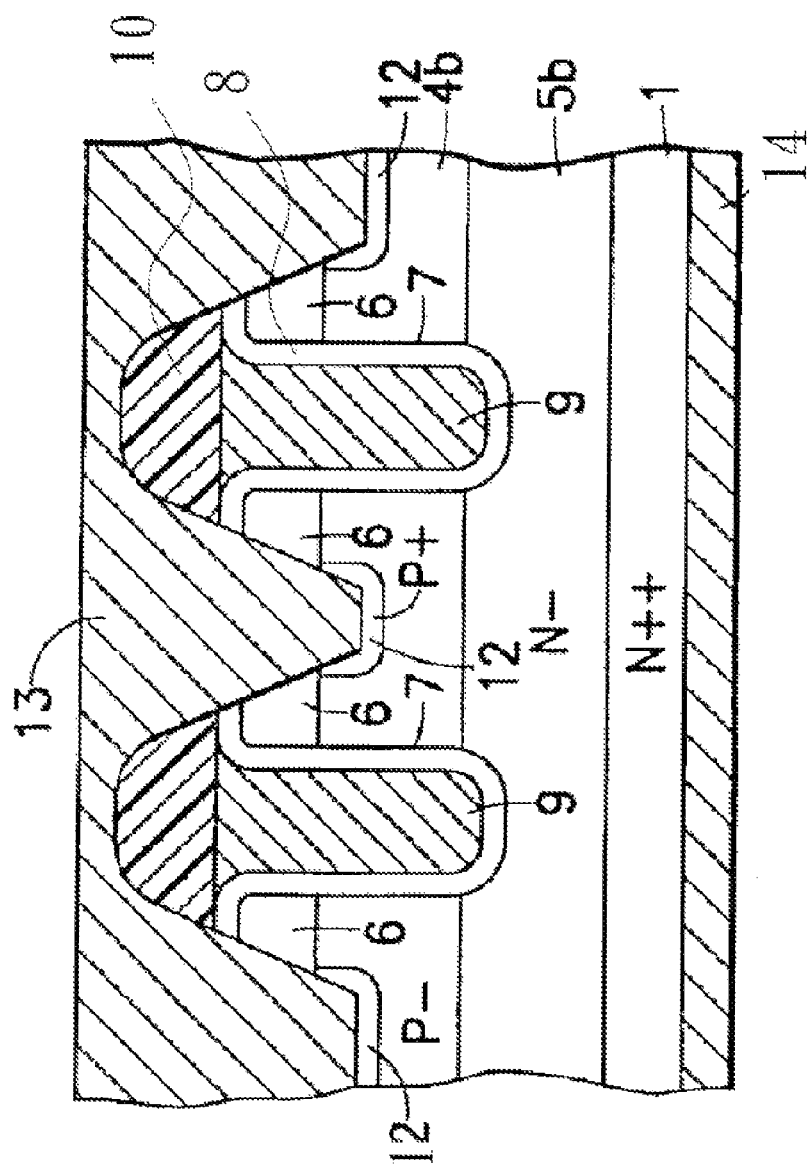
FIG. 1 illustrates a cross sectional view of a trench MOS transistor in prior art.
Figure 2A:
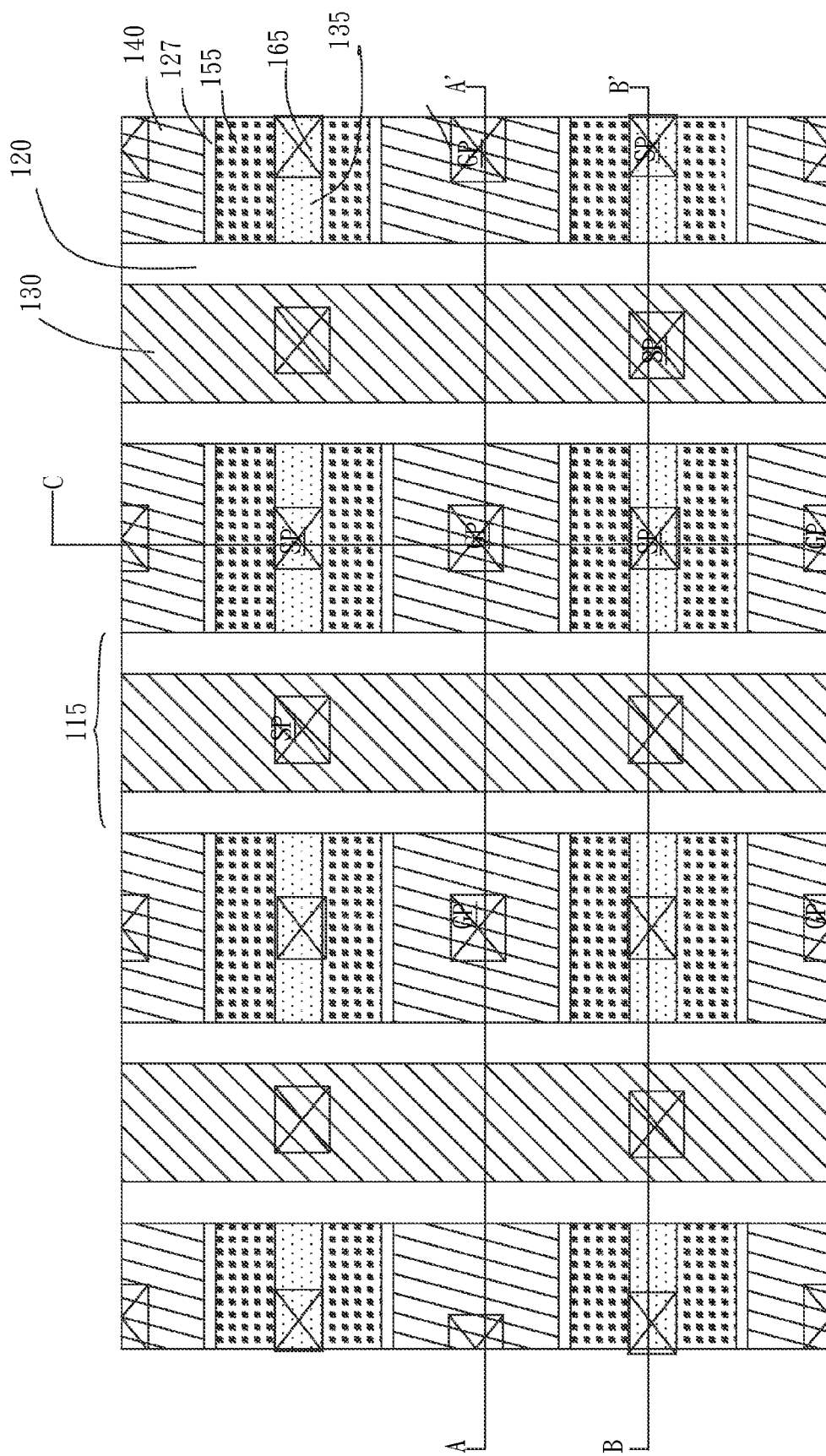
FIG. 2a illustrates a top view of the dual trench MOS structures to show the interconnect dielectric layer and the interconnect metal layer with the contact pads in the first embodiment according to the present invention.
Figure 8A:
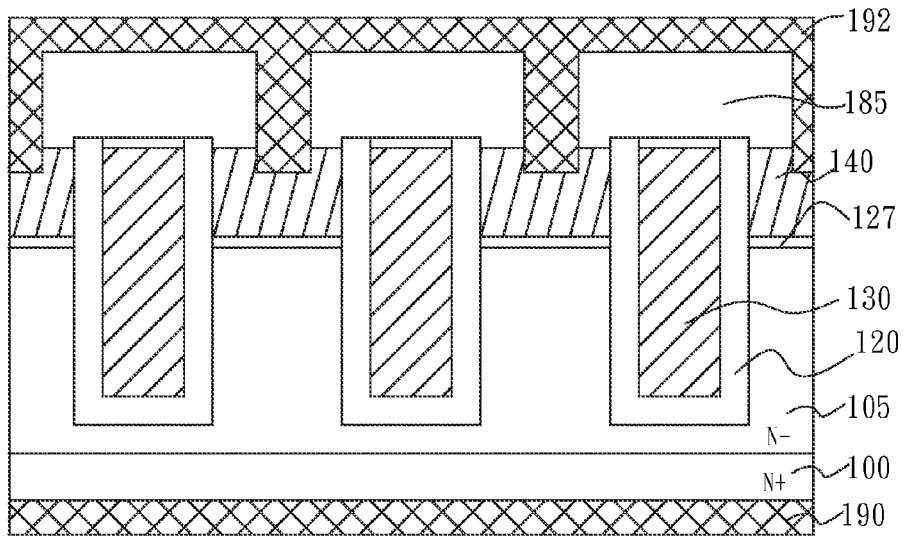
FIG. 8A, FIG. 8B and FIG. 8C are the cross sectional views respectively along the AA' line, the BB' line and the CC' line shown in FIG. 2a to illustrate the final structure of the dual trench MOS transistor according to the first embodiment of the present invention.
Figure 8B:
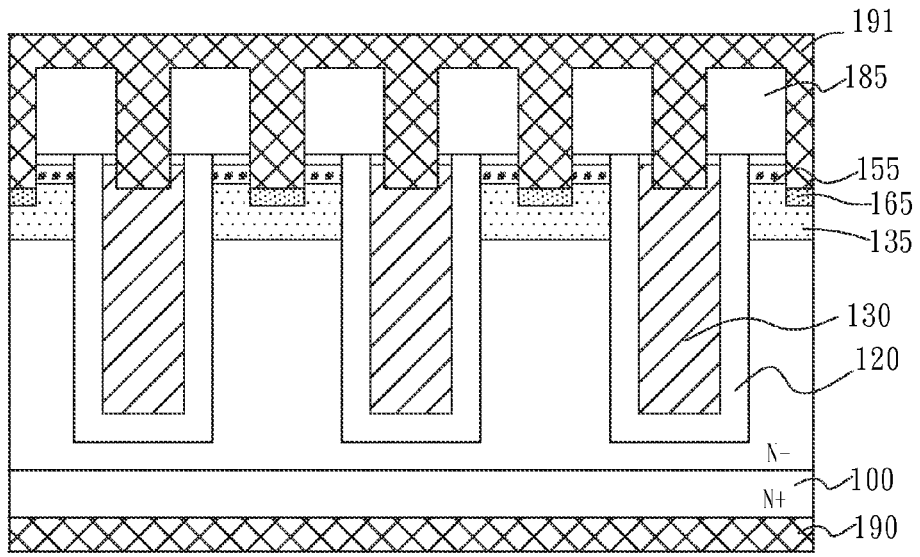
Figure 8C:
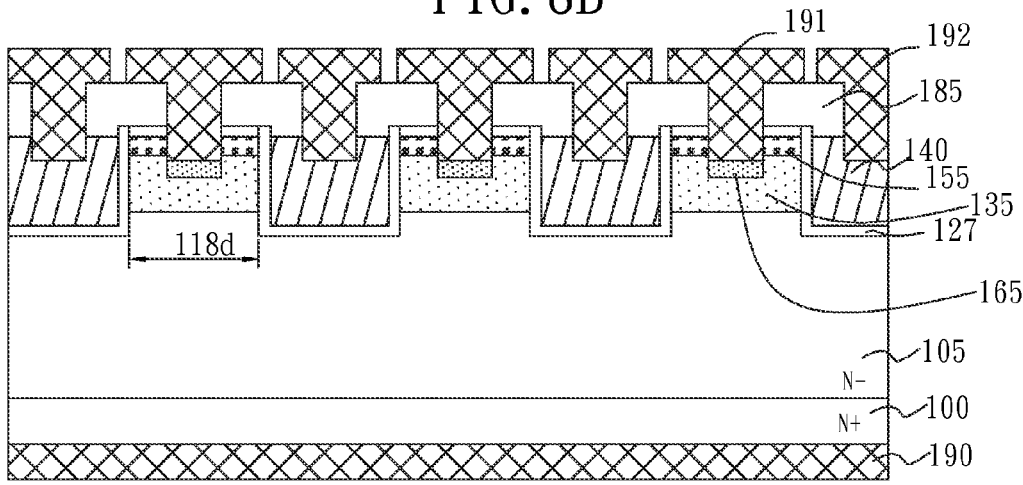

Please refer to the top view shown in FIG. 2a and the cross-sectional views shown in FIG. 8A to FIG. 8C, in the first embodiment of the present invention, the dual trench MOS transistor comprises of the following elements. A plurality of trenches 115 are formed in an n– epitaxial layer 105 on a heavy doped n+ semiconductor substrate 100 and are spaced to each other by a mesa 118. Each the trench 115 has a trench oxide layer 120 formed on a bottom and sidewalls thereof. A first polysilicon layer 130 with a conductive impurity is formed in the plurality of trenches 115. A plurality of recesses 125 are formed in the mesas and are spaced to each other by a sub-mesa 118d. Each the recess 125 has a recess oxide layer 127 formed on a bottom and sidewalls thereof and on the mesas 118. A second polysilicon layer 140 with a conductive impurity for serving as a gate is formed in the plurality of recesses 125 to form MOS structures. Each the MOS structure includes the second polysilicon layer 140, the recess oxide layer 127 and the n– epitaxial layer 105. Ion implanted areas 165, 155 and 135 are formed in the n– epitaxial layer 105 below the sub-mesas 118d at two sides of the MOS structures.

An interconnect dielectric layer 185 is formed on the first polysilicon layer 130, the second polysilicon layer 140 and the ion implanted areas 165, 155 and 135. A plurality of through holes are formed in the interconnect dielectric layer 185. A first group of the through holes 1881 connect a source contact pad SP. The source is made of the first polysilicon layer 130 in the plurality of trenches 115 and the ion implanted areas 165, 155 and 135. A second group of the through holes 1882 connect a gate contact pad GP. The MOS structures include the second polysilicon layer 140 in the recess 125, the recess oxide layer 127 and the n– epitaxial layer 105. An interconnect metal layer is formed on the interconnect dielectric layer 185 and in the plurality of the through holes and is patterned to form two separated patterns of a first metal pattern 191 for connecting to the source through the first group of the through holes 1881 and a second metal pattern 192 for connecting to the gate through the second group of the through holes 1882. A metal layer 190 is formed on a rear surface of the heavy doped n+ semiconductor substrate 100 for serving as a drain.

Figure 2B:
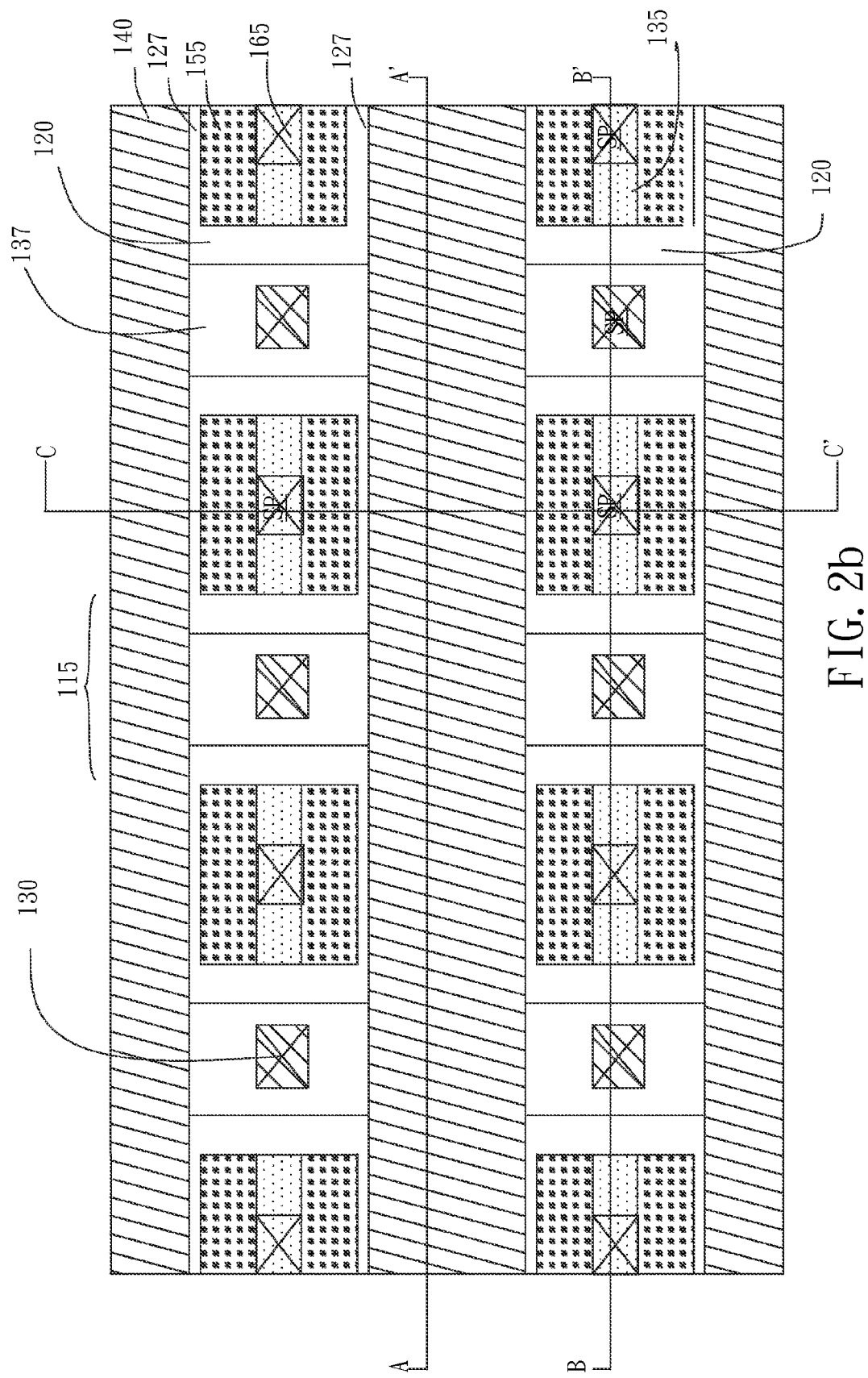
FIG. 2b illustrates a top view of the dual trench MOS structures to show the interconnect dielectric layer and the interconnect metal layer with the contact pads in the second embodiment according to the present invention.
Figure 15A:
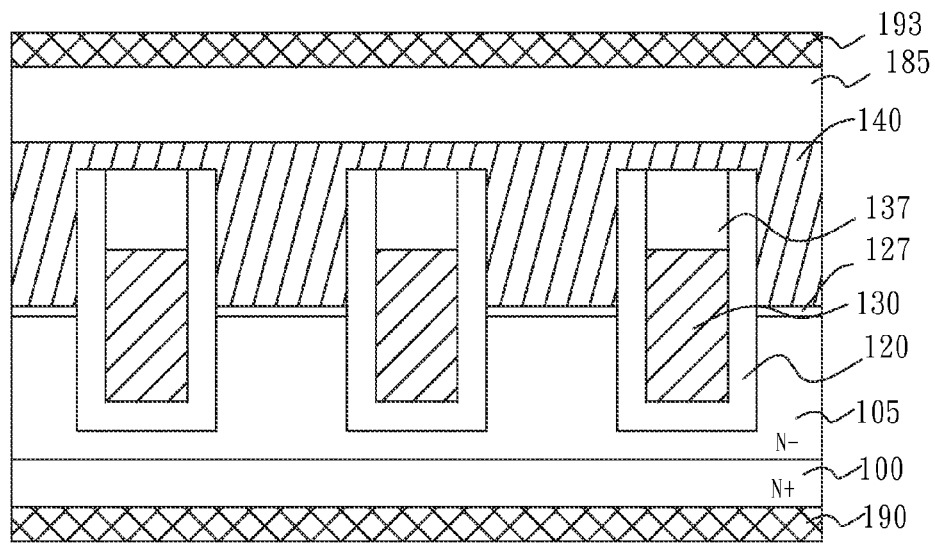
FIG. 15A, FIG. 15B and FIG. 15C are the cross sectional views respectively along the AA' line, the BB' line and the CC' line shown in FIG. 2b to illustrate the final structure of dual trench MOS structure according to the second embodiment of the present invention.
Figure 15B:
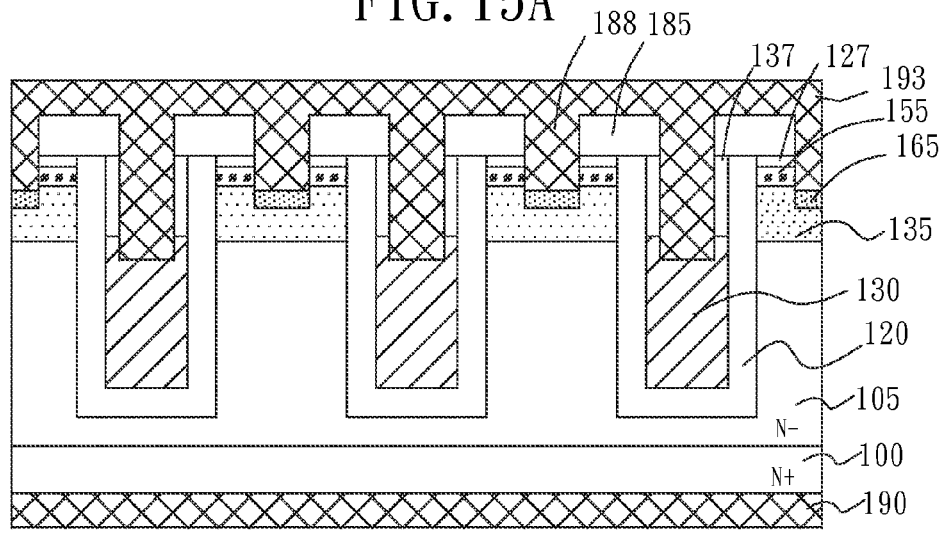
Figure 15C:
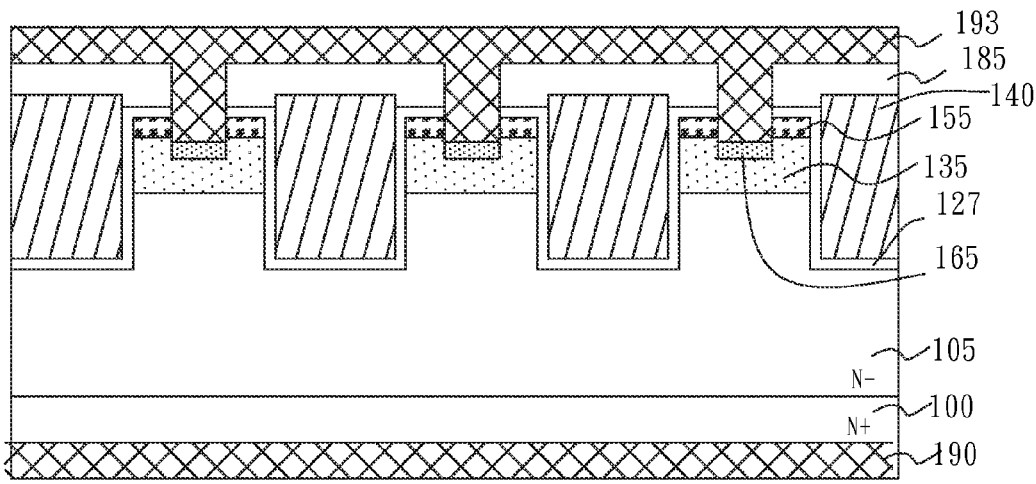

The second embodiment is illustrated in the top view of FIG. 2b and the cross sectional views of FIG. 15A to FIG. 15C. The second polysilicon layer 140 with a conductive impurity is filled into the recesses 125 and then is patterned by photolithography to form a plurality of rows of MOS structures which are orthogonal to the directions of the trenches 115. The second polysilicon layer 140 and the first polysilicon layer 130 in the trenches 115 are separated electrically by the oxide layer 137 in the trenches 115. The detail is described as follows.

A plurality of trenches 115 are formed in an n– epitaxial layer 105 on a heavy doped n+ semiconductor substrate 100 and are spaced to each other by one mesa 118. Each the trench 115 has a trench oxide layer 120 formed on a bottom and sidewalls thereof. A first polysilicon layer 130 with a conductive impurity is formed in the plurality of trenches 115. An oxide layer 137 is formed on the first polysilicon layer 130 in the plurality of trenches 115. A plurality of recesses 125 are formed in the mesas 118 and are spaced to each other by a sub-mesa 118d. Each the recess 125 has a recess oxide layer 127 formed on a bottom and sidewalls thereof. A second polysilicon layer 140 with a conductive impurity is formed in the plurality of recesses 125 and on the oxide layer 137 in the plurality of trenches 115. The second polysilicon layer 140 is patterned for serving as a gate to form a plurality of rows of MOS structures. Each the MOS structure includes the second polysilicon layer, the recess oxide layer and the n– epitaxial layer.

Ion implanted areas 165, 155 and 135 are formed in the n– epitaxial layer 105 below the mesas at two sides of the MOS structures.

An interconnect dielectric layer 185 is formed on the first polysilicon layer 130, the second polysilicon layer 140 and the recess oxide layer 127. A plurality of through holes are formed in the interconnect dielectric layer 185 for connecting the source contact pad SP. The source is made of the ion implanted areas 165, 155 and 135 and the first polysilicon layer 130 in the plurality of trenches 115. The through holes are also through the oxide layer 137 for connecting the first polysilicon layer 130 in the plurality of trenches 115. An interconnect metal layer 193 is formed on the interconnect dielectric layer 185 and in the through holes for connecting the source. The gate is connecting outwardly via the terminal end of the second polysilicon layer 140. A bottom metal layer 190 is formed on a rear surface of the heavy doped n+ semiconductor substrate 100 for serving as a drain.

The detailed process is illustrated as follows. It is noted that the minus sign "−" following n or p means lightly doped and the plus sign "+" means heavy doped.

Figure 3:
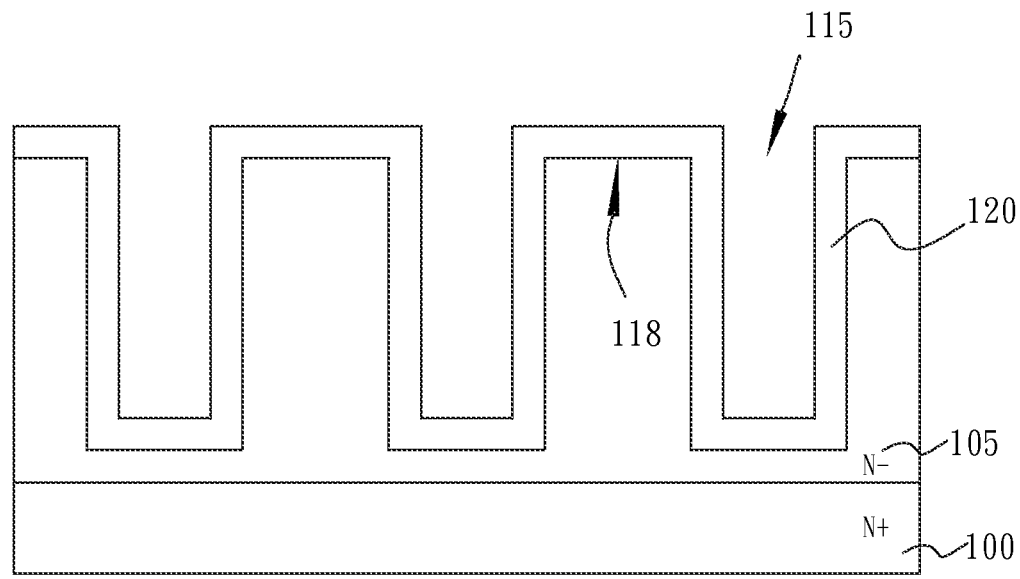
FIG. 3 illustrates a cross sectional view of the trenches formed in the n− epitaxial layer having the trench oxide layer.

Please refer to the cross sectional view shown in FIG. 3, which illustrates that the n+ semiconductor substrate 100 with heavy doped n type impurity includes an n− epitaxial layer 105 with lightly doped n type impurity. A dry etching process is performed to form the plurality trenches 115 by using the photoresist pattern as an etching mask (not shown) or using a hard mask (not shown) as well known in prior art.

Then, a thermal oxidation process is performed to form the trench oxide layer 120 on the bottom and sidewalls of the trenches 115. This step can also fix the damage occurred in the etching step before.

Figure 4:
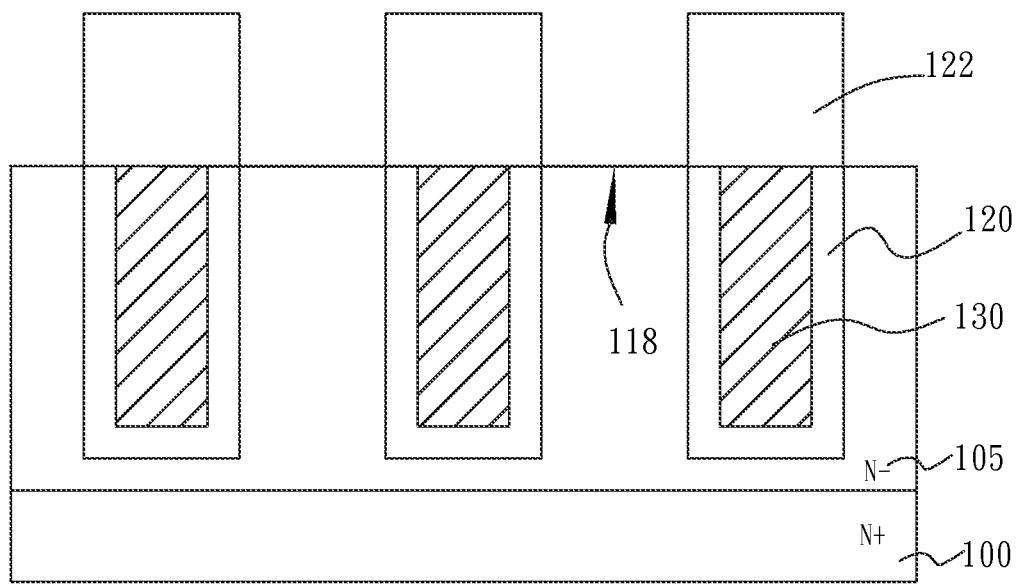
FIG. 4 is a cross sectional view of the trenches and the trench oxide layer illustrating that the first polysilicon layer is filled therein and etched back to remove the portions of the first polysilicon layer and the trench oxide layer over the mesas and then a photoresist pattern defining the locations of recesses is formed.

Please refer to FIG. 4, the first polysilicon layer 130 with a conductive impurity is deposited and doped to fill fully and cover the trenches 115. Then, an etching back procedure or a chemical mechanical polishing (CMP) process is applied to remove the first polysilicon layer 130 on the mesas 118 until the upper surface of the n− epitaxial layer 105 is exposed. After etching back, the photoresist pattern 122 is formed to define the locations of recesses 125. The intervals between openings of the photoresist pattern 122 cover portions of the mesas 118. That is, the photoresist pattern 122 deposited on the mesas 118 is applied to provide protection for portions of the mesas 118 along the B-B' line (not shown) and the first polysilicon layer 130 in the trenches 115.

Figure 5A:
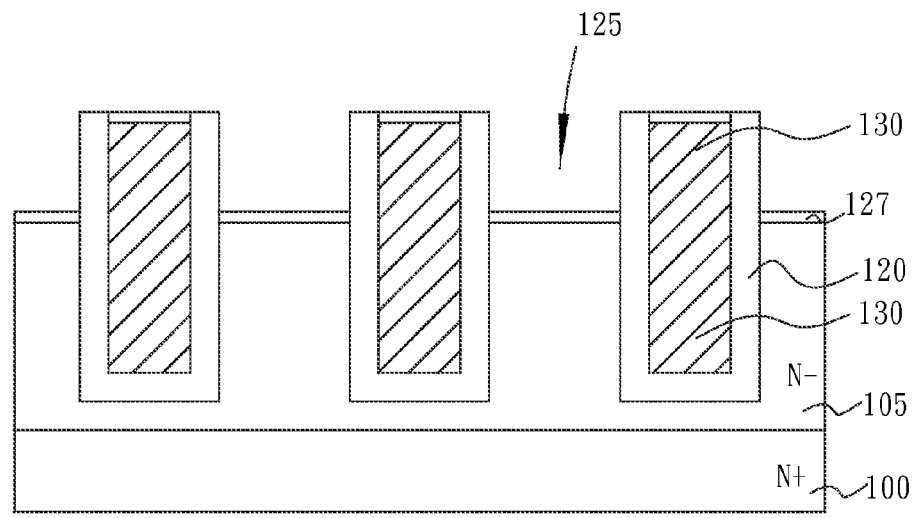
FIG. 5A, FIG. 5B and FIG. 5C are the cross sectional views respectively along the AA' line, the BB' line and the CC' line shown in FIG. 2a to illustrate the recesses and the recess oxide layer.
Figure 5B:
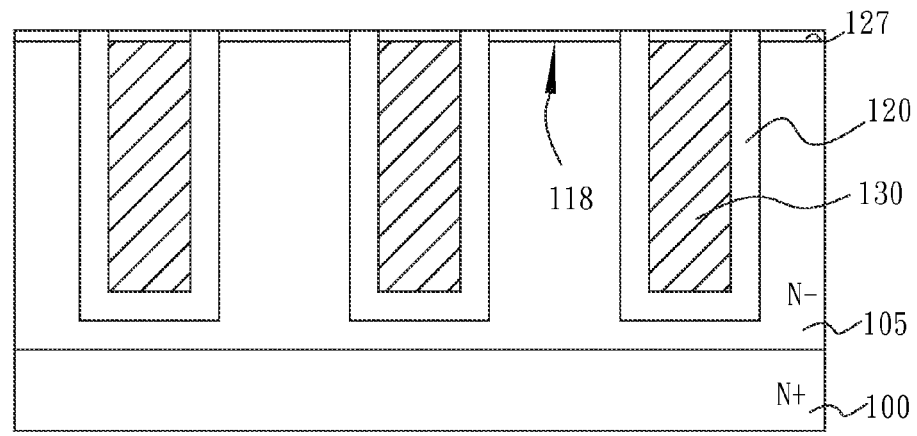
Figure 5C:
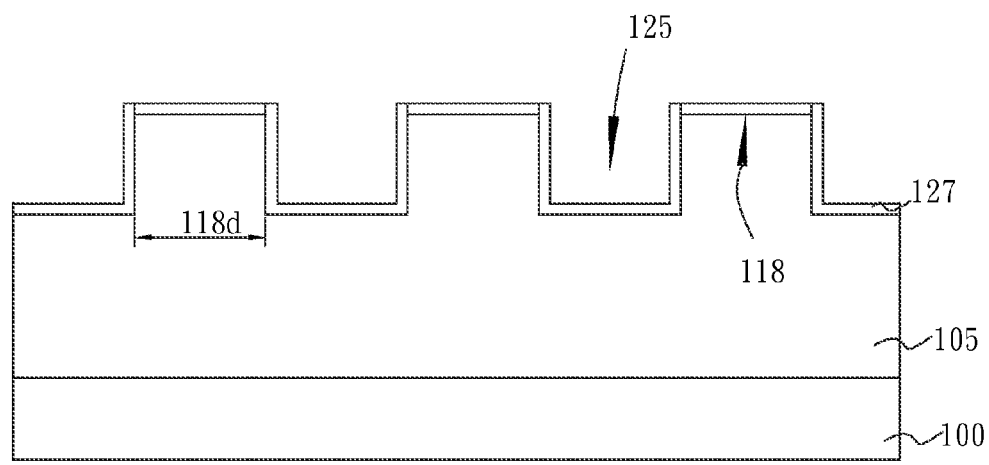

Then, referring to FIG. 5A to FIG. 5C, which illustrate respectively the cross sectional views perpendicular to the directions of the trenches 115 at two different locations and the cross sectional view along the directions of the mesas 118. A plasma etching process is performed to form the recesses 125 in the mesas 118 by using the photoresist pattern 122 as an etching mask. Then, a thermal oxidation process is performed to form the recess oxide layer 127 on the bottom and sidewalls of the recesses 125 and on the upper surface of the mesas. The recess oxide layer 127 is also formed on the first polysilicon layer 130. The photoresist pattern 122 is then removed. It is noted that the recess oxide layer 127 is formed only on the bottom and some specific sidewalls of recesses 125, wherein the normal lines of the specific sidewalls are parallel to the directions of the trenches 115.

It is noted that the recess oxide layer 127 is thinner than the trench oxide layer 120.

Figure 6A:
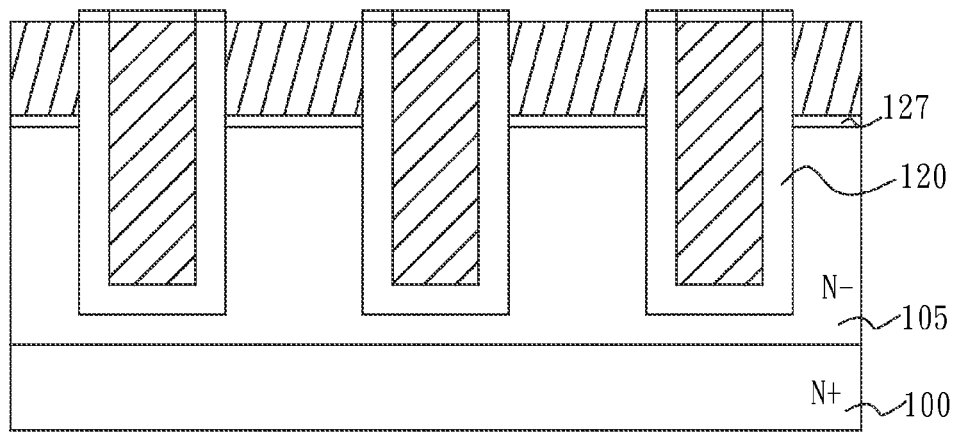
FIG. 6A, FIG. 6B and FIG. 6C are the cross sectional views respectively along the AA' line, the BB' line and the CC' line shown in FIG. 2a to illustrate that the second polysilicon layer is formed and then is etched back and the two ion implanting steps are performed.
Figure 6B:
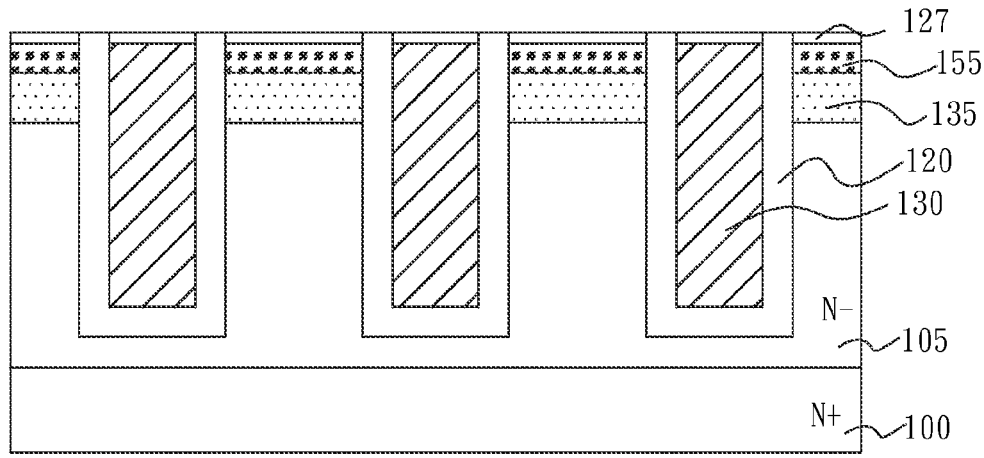
Figure 6C:
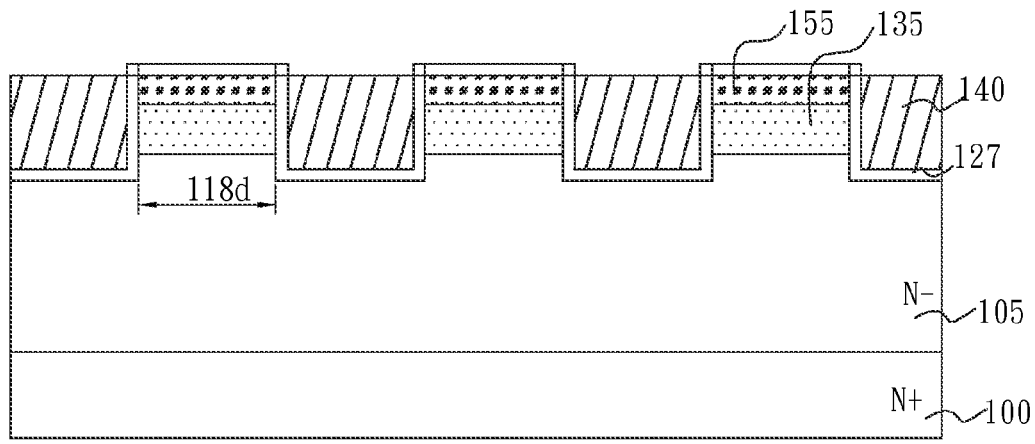

Then, as shown in FIG. 6A to FIG. 6C, the second polysilicon layer 140 is deposited and doped with a conductive impurity to overfill all the recesses 125. An etching back process or a chemical mechanical polishing (CMP) process is performed to remove the second polysilicon layer 140 on the mesas 118, wherein the recess oxide layer 127 is serving as an etching stopper. Please refer to FIG. 6A to FIG. 6C, the cross sectional views along two directions are shown. The recesses 125 are spaced to each other by a sub-mesa 118d.

Then two ion implanting procedures are performed. The first ion implanting is to implant totally the p type conductive ions into the n− epitaxial layer 105 for forming p type bodies 135 below the mesas 118 at two sides of the MOS structures. The MOS structures include the second polysilicon layer 140 in the recesses 125, the recess oxide layer 127 and the n− epitaxial layer 105. The dosage of implanted ions are adjusted to have the concentration of ions in the p type bodies 135 higher than that in the n− epitaxial layer 105 about 1 to 3 orders in magnitudes, such as 1E12-1E14/cm$^2$. The energy of implanting is about 10 keV-1000 keV. The second ion implanting is to implant totally the n type conductive ions, such as As+ or P+. The dosage of implanted ions is about 1E13-9E15/cm$^2$. The energy of implanting is about 5 keV-300 keV. The second ion implanting is performed by using low energy to implant the shallow n+ implanted areas 155 on upper portions of the p type bodies 135. That is, the p type bodies 135 are deeper than the n+ implanted areas 155.

Figure 7A:
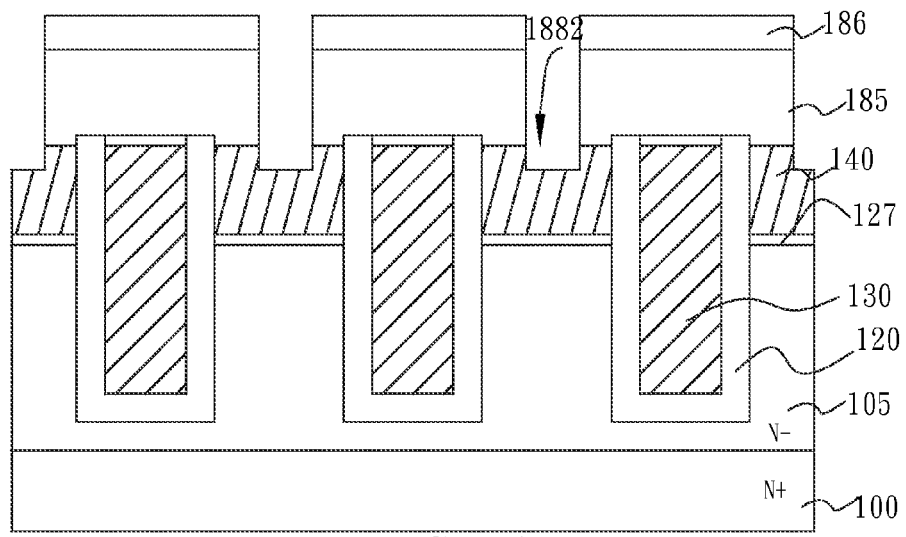
FIG. 7A, FIG. 7B and FIG. 7C are the cross sectional views respectively along the AA' line, the BB' line and the CC' line shown in FIG. 2a to illustrate that after the second ion implanting the interconnect dielectric layer is formed and etched to form the first and second groups of the through holes and then the third ion implanting is performed.
Figure 7B:
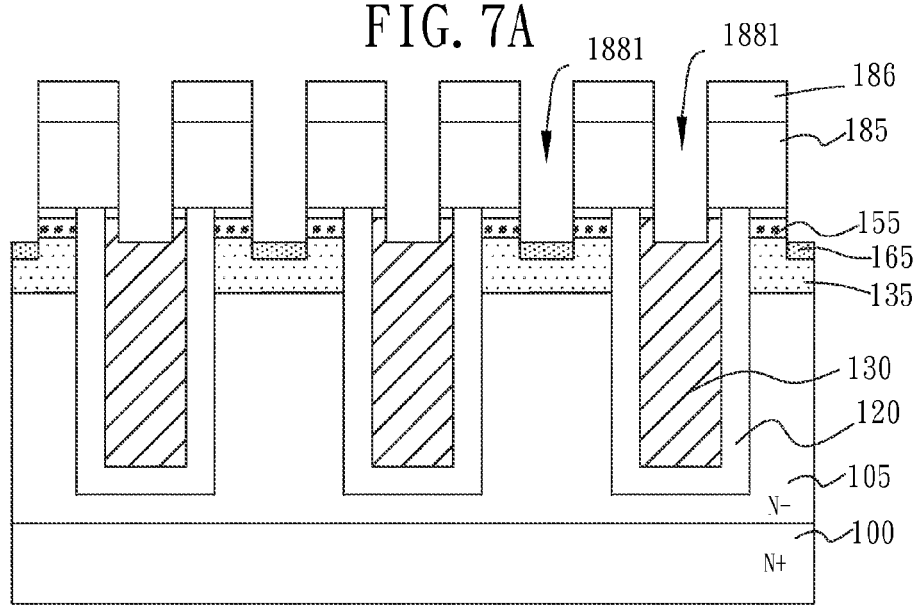
Figure 7C:
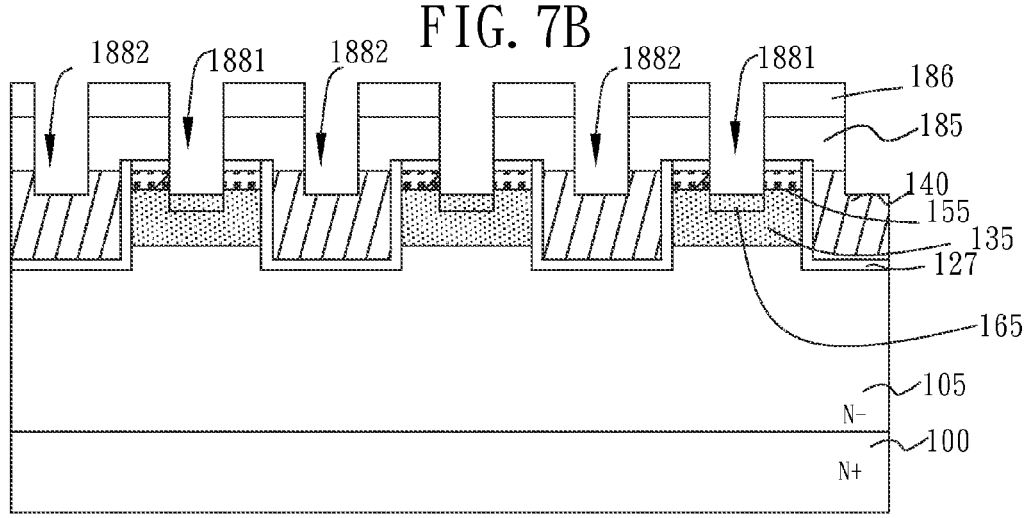

Please refer to FIG. 7A to FIG. 7C, the interconnect dielectric layer 185 is formed on the second polysilicon layer 140 and the recess oxide layer 127 on the mesas. Then the interconnect dielectric layer 185 is etched by using a photoresist pattern 186 as the mask to form the first group of the through holes 1881 and the second group of the through holes 1882 therein. The through holes 1881 and 1882 are penetrating through the interconnect dielectric layer 185, and having slightly concave troughs on the first polysilicon layer 130 and penetrating through the n+ heavy ion implanted areas 155. A third ion implanting is performed to implant p+ ions into the bottoms of all the through holes to form the p+ implanted areas 165 as shown in drawings. The dosage of implanting p+ ions is less than that of implanting n+ ions.

The first group of the through holes 1881 connect the first polysilicon layer 130 and the n+ ion implanted areas 155 which are serving as the source. The second group of the through holes 1882 connect the second polysilicon layer 140 in the recesses 125 which are serving as the gate.

Please refer to FIG. 8A to FIG. 8C, after removing the photoresist pattern 186, an interconnect metal layer is formed on the interconnect dielectric layer 185 and filled in all the through holes 1881 and 1882. The interconnect metal layer is patterned to form the first metal pattern 191 and the second metal pattern 192 at different regions for respectively connecting the source and the gate.

At last, another metal layer 190 is formed on the rear surface of the heavy doped n+ semiconductor substrate 100 for serving as the drain.

Figure 9:
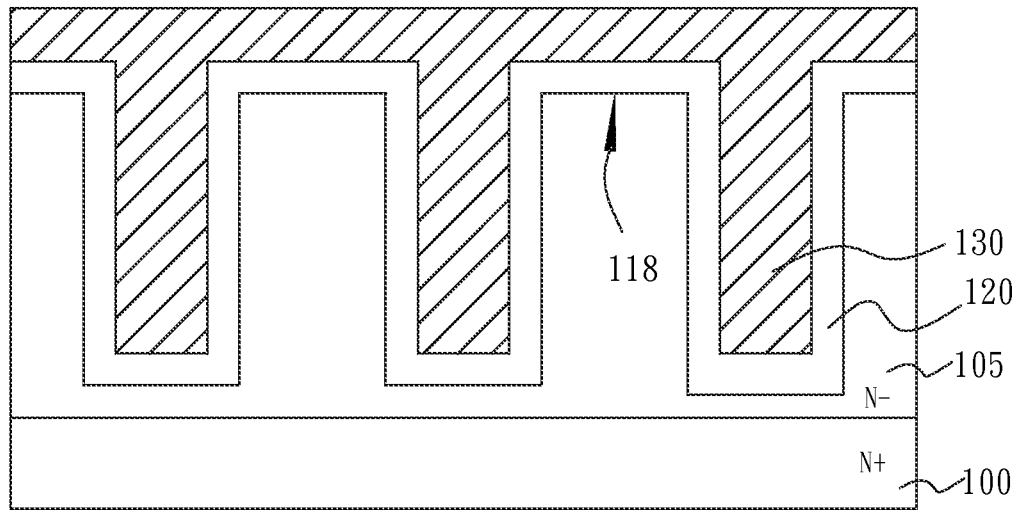
FIG. 9 illustrates a cross sectional view of the trenches, the trench oxide layer and the first polysilicon layer according to the second embodiment of the present invention.

The above design can be varied as illustrated in the second embodiment as follows. Please refer to the cross sectional view shown in FIG. 9. The process illustrated in FIG. 9 is following the steps shown in FIG. 3. After forming the trenches 115, the trench oxide layer 120 is deposited and then the first polysilicon layer 130 is overfilled in the trenches 115.

Figure 10:
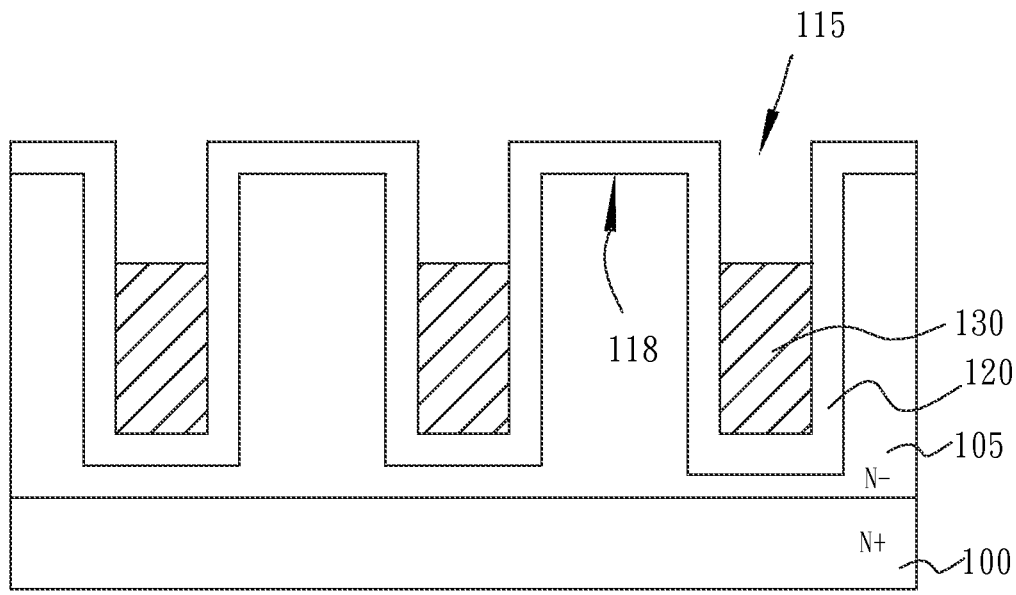
FIG. 10 illustrates a cross sectional view to show that the first polysilicon layer is etched back to have concave surface in trenches according to the second embodiment of the present invention.

Please refer to FIG. 10, an etching back procedure is then performed to etch back the first polysilicon layer 130. After etching back to the trench oxide layer 120, the etching back procedure is continued by reckoning time until the depth of the concave surface of the first polysilicon layer satisfying the predetermined target. The space of the concave surface is applied for refilling the oxide layer 137.

Figure 11:
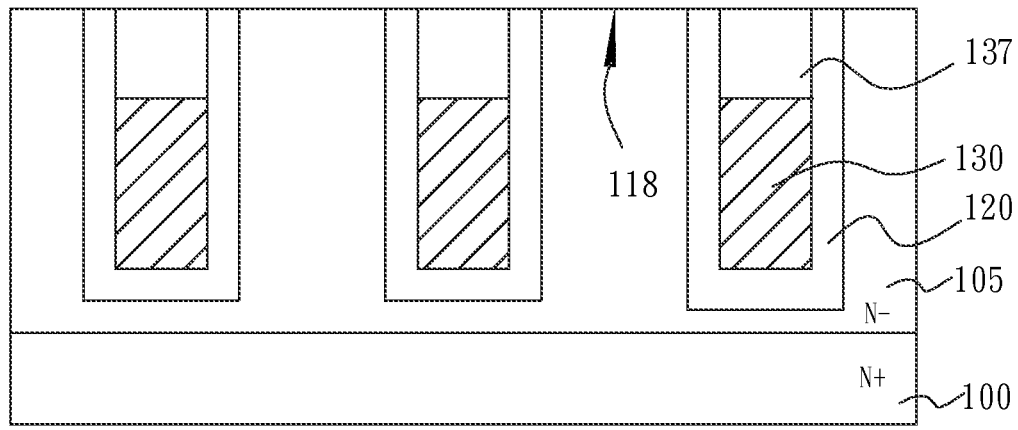
FIG. 11 illustrates a cross sectional view to show that the oxide layer is formed on the first polysilicon layer is overfilled in the trenches and then is etched back according to the second embodiment of the present invention.

Please refer to FIG. 11, the oxide layer 137 is then overfilled into the trenches 115 and covering the mesas. An etching back or CMP (Chemical Mechanic Polish) procedure is done to etch or polish back the oxide layer 137 and to remove the trench oxide layer 120 on the mesas 118 incidentally.

Figure 12:
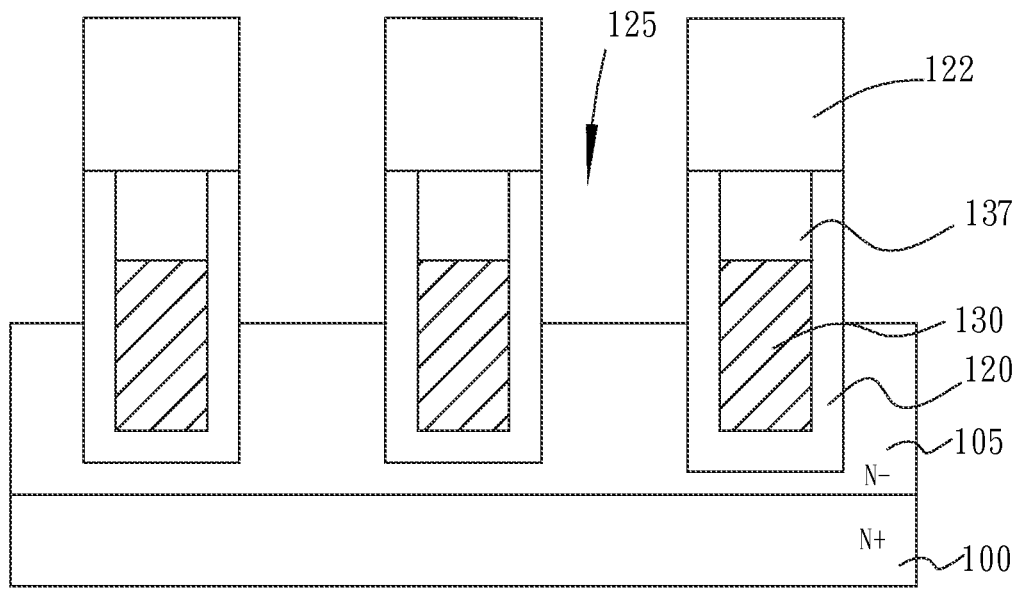
FIG. 12 illustrates a cross sectional view to show that the photoresist pattern for defining the locations of recesses is formed and an etching procedure is performed to form the recesses according to the second embodiment of the present invention.

Please refer to FIG. 12, a photoresist pattern 122 is formed to define the locations of the recesses 125. The intervals between openings of the photoresist pattern 122 cover the mesas 118. The photoresist pattern 122 deposited on the mesas 118 is applied to provide protection for the portions of the mesas 118 along the B-B' line (not shown) and the first polysilicon layer 130 in the trenches 115. Then, a plasma etching process is performed to form the recesses 125 by using the photoresist pattern 122 as an etching mask. The photoresist pattern 122 is then removed.

Figure 13A:
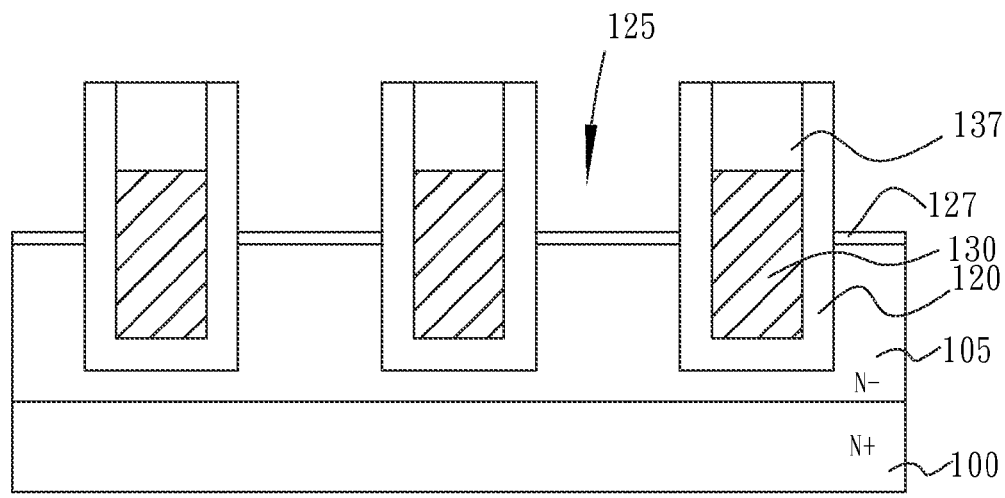
FIG. 13A, FIG. 13B and FIG. 13C are the cross sectional views respectively along the AA' line, the BB' line and the CC' line shown in FIG. 2b to illustrate the recess oxide layer according to the second embodiment of the present invention.
Figure 13B:
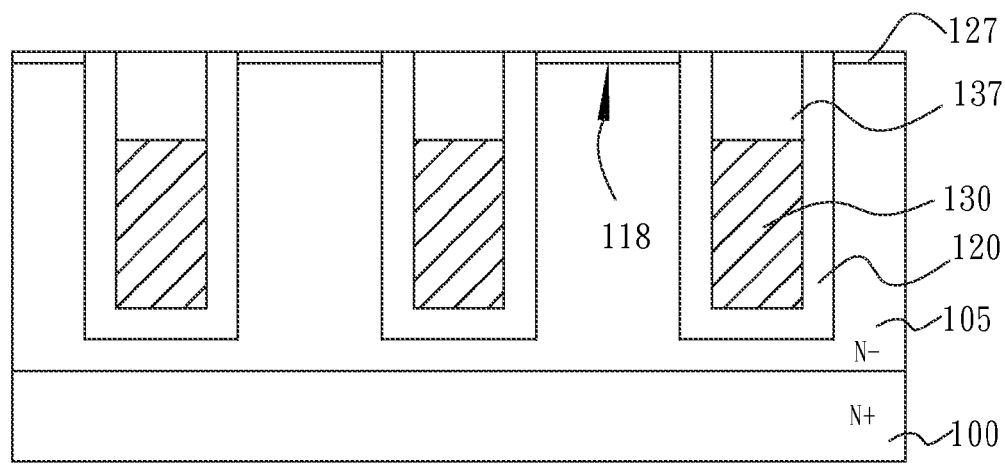
Figure 13C:
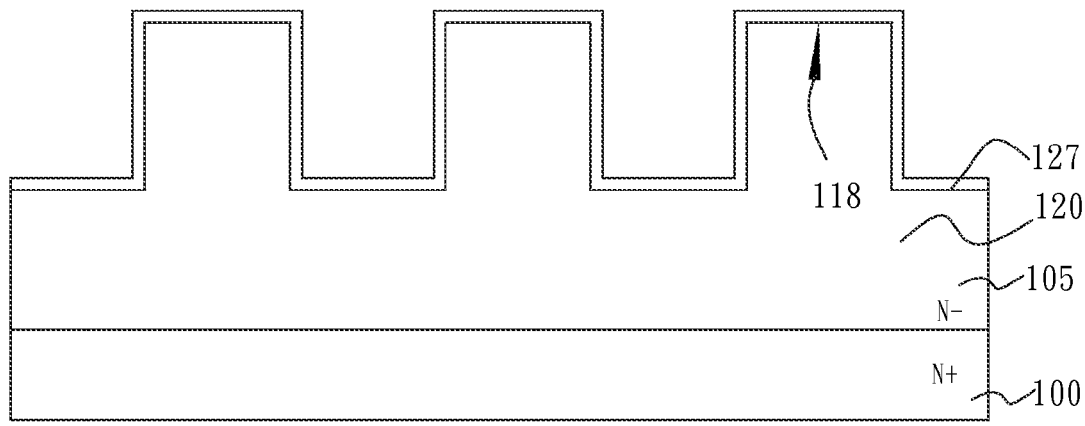

Please refer to FIG. 13A to FIG. 13C, which illustrate respectively the cross sectional views perpendicular to the directions of the trenches 115 at two different locations and the cross sectional view along the directions of the mesas 118. Then, a thermal oxidation process is performed to form the recess oxide layer 127 on the bottom and some specific sidewalls of the recesses 125 and on the upper surface of the mesas 118. It is noted that the normal lines of the specific sidewalls are parallel to the directions of the trenches 115.

It is noted that the recess oxide layer 127 is thinner than the trench oxide layer 120. Besides, the first polysilicon layer 130 along the AA' line or the BB' line are deposited with the oxide layer 137 thereon for separation from the second polysilicon layer 140.

Figure 14A:
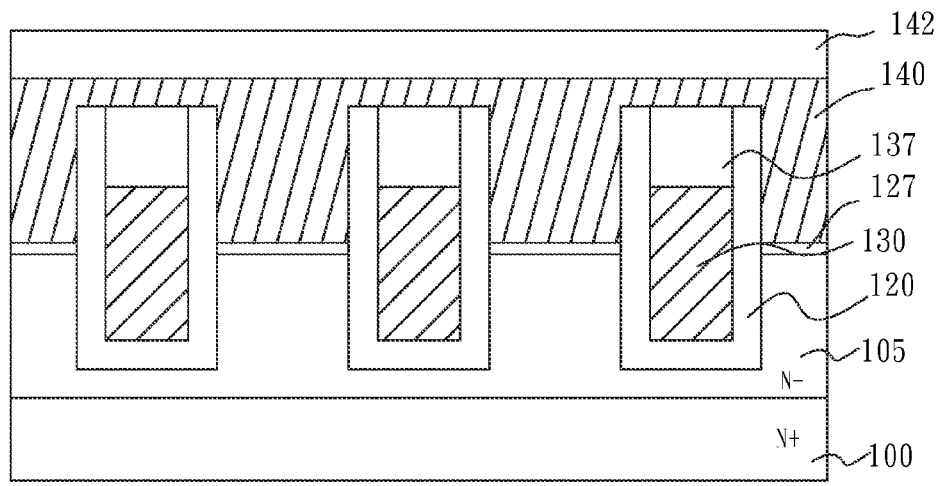
FIG. 14A, FIG. 14B and FIG. 14C are the cross sectional views respectively along the AA' line, the BB' line and the CC' line shown in FIG. 2b to illustrate that the second polysilicon layer is formed and etched by photolithography and then the two ion implanting steps are performed according to the second embodiment of the present invention.
Figure 14B:
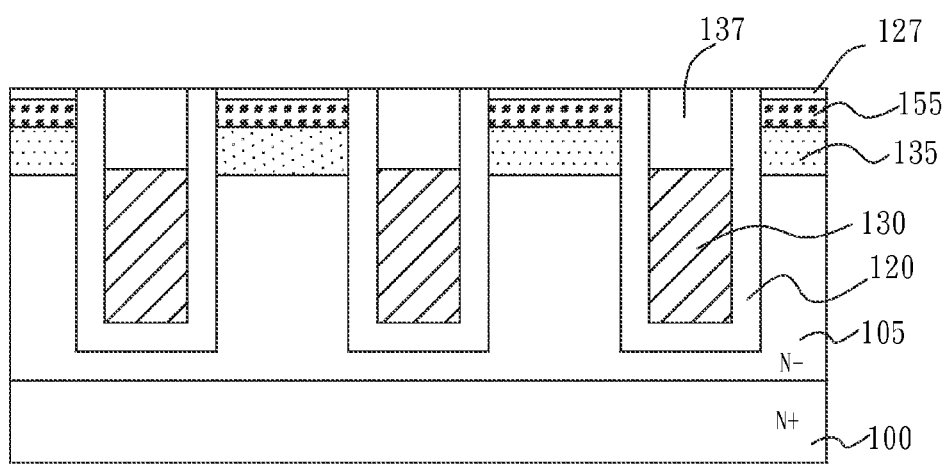
Figure 14C:
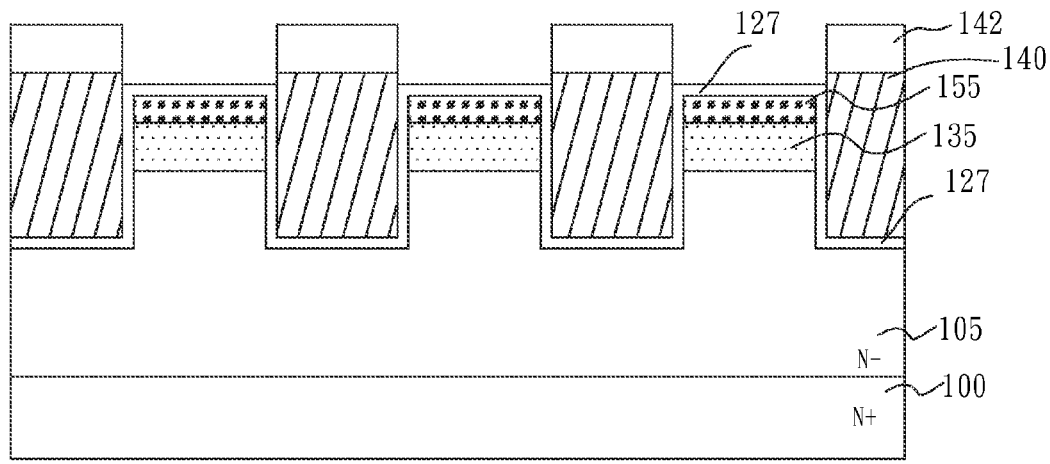

Please refer to FIG. 14A to FIG. 14C, the second polysilicon layer 130 with a conductive impurity is deposited and doped to overfill all the recesses 125 and cover the mesas 118. Then, a photoresist pattern 142 is formed on the second polysilicon layer 140 to define the locations of the rows of the MOS structures. The openings of the photoresist pattern 142 are along the direction of the BB' line on the mesas for defining the locations of implanted areas.

An etching process is performed by using the photoresist pattern 142 as an etching mask to remove the second polysilicon layer 140 exposed by the etching mask.

Then, as shown in FIG. 14A to FIG. 14C, two ion implanting procedures are performed. The first ion implanting is to implant the p type conductive ions into the n– epitaxial layer 105 for forming p type bodies 135 below the mesas 118 at two sides of the MOS structures. The MOS structures include the second polysilicon layer 140 in the recesses 125, the recess oxide layer 127 and the n– epitaxial layer 105. The dosage and energy are same as that applied in the first embodiment. Then, the second ion implanting is performed to implant totally the n type conductive ions. The second ion implanting is to form the shallow n+ implanted areas 155 on upper portions of the p type bodies 135. The dosage and energy are same as that applied in the first embodiment. Then, the photoresist pattern 142 is removed.

Please refer to FIG. 15A to FIG. 15C, the interconnect dielectric layer 185 is formed on the second polysilicon layer 140 on the mesas, the recess oxide layer 127 and the oxide layer 137.

Then, an etching procedure is performed to form the through holes in the interconnect dielectric layer 185 as illustrated in the first embodiment. It is noted that all the through holes here are the first group of the through holes 1881 applied for connecting the source, namely connecting to the implanted areas and the first polysilicon layer 130 below the oxide layer 137. The through holes 1881 are also penetrating through the interconnect dielectric layer 185, and forming slightly concave troughs on the first polysilicon layer 130 and penetrating through the n+ heavy ion implanted areas 155. After, a third ion implanting is performed to implant p+ ions into the bottoms of all the through holes to form the p+ implanted areas 165 as shown. The dosage of implanting p+ ions is less than that of implanting n+ ions as aforementioned in the first embodiment. After implanting, an anneal process is performed to active the implanted ions.

The directions of the row of the MOS structures are perpendicular to the trenches 115. Because the second polysilicon layer 140 is continuous in the rows of the MOS structures, there is no need to form the extra through holes to connect the gate of each MOS structure, and the end terminal of the second polysilicon layer 140 can be wiring for applying the voltage to serve as the gate.

Please refer to FIG. 15A to FIG. 15C, an interconnect metal layer 193 is formed on the interconnect dielectric layer 185 and filled in all the through holes.

At last, another metal layer 190 is formed on the rear surface of the heavy doped n+ semiconductor substrate 100 for serving as the drain.

The present invention has following advantages. Comparing to the traditional trench MOS structures, the dual trench MOS structures of the present invention have the first polysilicon layer in the trenches connect with the source, thereby the electrons of epitaxial layer of trenches can be depleted to form depletion regions at turn-off (reversal of biasing) for promoting break-down voltage considerably, or when the break-down voltage is same as that in prior art the resistance will be decreased dramatically because the dopant concentration in the epitaxial layer is increased. Besides, the MOS structures proposed by the present invention can lower reverse leakage current considerably. Further, the dual trench MOS structures of the present invention can bear higher bias current on the same plane area than that in the prior art.

The preferred embodiments of the invention have been set forth as above description, however the spirit and scope of the present invention are not limited to the aforementioned embodiments. It is easy for those who with ordinary skill in the art to understand and have modifications of the disclosed embodiments for the same purpose. Therefore, the appended claims are intended to cover all embodiments which do not depart from the spirit and scope of the invention. For example, the aforementioned embodiments disclosed the structures and manufacturing methods of the n type dual trench MOS devices. However, it is easy to have a simple alternation of replacing the n type dopant by the p type dopant. Therefore, the structures and manufacturing methods disclosed by the present invention can also be applied to form the p type dual trench MOS devices.

What is claimed is:

1. A dual trench MOS transistor comprising of:
a plurality of trenches formed in an n– epitaxial layer on a heavy doped n+ semiconductor substrate and spaced with each other with one of mesas, wherein each the trench has a trench oxide layer formed on a bottom and sidewalls thereof, a first polysilicon layer with a conductive impurity is formed in the plurality of trenches;
a plurality of recesses formed in the mesas, wherein each the recess has a recess oxide layer formed on a bottom and sidewalls thereof, a second polysilicon layer with a conductive impurity for serving as a gate is formed in the plurality of recesses to form MOS structures, wherein each the MOS structure includes the second polysilicon layer, the recess oxide layer and the n– epitaxial layer;
ion implanted areas formed in the n– epitaxial layer below the mesas at two sides of the MOS structures;
an interconnect dielectric layer formed on the first polysilicon layer, the MOS structures and the ion implanted areas;
a plurality of through holes formed in the interconnect dielectric layer, wherein a first group of the through holes connect the first polysilicon layer formed in the plurality of the trenches and the ion implanted areas which are applied to serve as a source and a second group of the through holes connect the gate of the MOS structures;

an interconnect metal layer formed on the interconnect dielectric layer and in the plurality of the through holes and patterned to connect the source and the gate respectively through the first group and the second group of the through holes; and a metal layer formed on a rear surface of the heavy doped n+ semiconductor substrate for serving as a drain.

2. The dual trench MOS transistor of claim 1, wherein the ion implanted areas includes a p type body, an n+ implanted area and a p+ implanted area, wherein the p type body is deeper than the n+ implanted area and the p+ implanted area is located at middle of the n+ implanted area.

3. The dual trench MOS transistor of claim 1, wherein the recess oxide layer is formed on the bottom and some specific sidewalls of the plurality of the recesses, wherein the normal lines of the specific sidewalls are parallel to the directions of the plurality of the trenches.

4. The dual trench MOS transistor of claim 1, wherein the MOS structures including the second polysilicon layer, the recess oxide layer and the n− epitaxial layer are formed in the plurality of the recesses.

5. A dual trench MOS transistor comprising of:

a plurality of trenches formed in an n− epitaxial layer on a heavy doped n+ semiconductor substrate and spaced with each other with one of mesas, wherein each the trench has a trench oxide layer is formed on a bottom and sidewalls thereof and formed on the mesas, a first polysilicon layer with a conductive impurity is formed in the plurality of the trenches, the top of the first polysilicon layer is lower than tops of the mesas, and an oxide layer is formed on the first polysilicon layer in the plurality of the trenches;

a plurality of recesses formed in the mesas, wherein each the recess has a recess oxide layer formed on a bottom and sidewalls thereof, a second polysilicon layer with a conductive impurity for serving as a gate is formed in the plurality of recesses and on the oxide layer in the plurality of the trenches, the second polysilicon layer is patterned to form a plurality of rows of MOS structures, wherein each the MOS structure includes the second polysilicon layer, the recess oxide layer and the n− epitaxial layer;

ion implanted areas formed in the n− epitaxial layer below the mesas adjacent to the MOS structures by implanting conductive ions;

an interconnect dielectric layer formed on the first polysilicon layer, the oxide layer and the ion implanted areas;

a plurality of through holes formed in the interconnect dielectric layer, wherein the through holes connect the first polysilicon layer in the plurality of the trenches and the ion implanted areas which are applied to serve as a source;

an interconnect metal layer formed on the interconnect dielectric layer and in the plurality of the through holes for connecting the source; and a metal layer formed on a rear surface of the heavy doped n+ semiconductor substrate for serving as a drain.

6. The dual trench MOS transistor of claim 5, wherein the ion implanted areas include a p type body, an n+ implanted area and a p+ implanted area, wherein the p type body is deeper than the n+ implanted area and the p+ implanted area is located at middle of the n+ implanted area.

7. The dual trench MOS transistor of claim 5, wherein a gate of the dual trench MOS transistor is connecting outwardly via the terminal end of the second polysilicon layer of the MOS structures.

8. The dual trench MOS transistor of claim 5, wherein the recess oxide layer is formed on the bottom and some specific sidewalls of the plurality of the recesses, wherein the normal lines of the specific sidewalls are parallel to the directions of the plurality of the trenches.

* * * * *